United States Patent [19]

Killion et al.

[11] Patent Number: 5,128,566
[45] Date of Patent: Jul. 7, 1992

[54] VARIABLE ATTENUATOR CIRCUIT

[75] Inventors: Mead C. Killion, Elk Grove Village; Donald L. Wilson, Roselle, both of Ill.

[73] Assignee: Etymotic Research, Inc., Elk Grove, Ill.

[21] Appl. No.: 431,540

[22] Filed: Nov. 3, 1989

[51] Int. Cl.$^5$ .......................... H03K 5/08; H01P 1/22
[52] U.S. Cl. ................... 307/567; 307/549; 307/491; 333/81 R
[58] Field of Search ............... 307/540, 549, 555, 567, 307/491, 264; 333/81 R

[56] References Cited

U.S. PATENT DOCUMENTS

| | | | |
|---|---|---|---|
| 3,553,486 | 1/1971 | Dow | 307/549 |
| 4,170,720 | 10/1979 | Killion | |
| 4,216,427 | 8/1980 | Bethards | 307/264 |
| 4,339,677 | 7/1982 | Hoeft | 307/264 |
| 4,357,499 | 11/1982 | Brüel | |
| 4,395,643 | 7/1983 | Lehmann | 307/264 |
| 4,405,831 | 9/1983 | Michelson | |
| 4,476,426 | 10/1984 | Kishimoto et al. | 307/549 |

FOREIGN PATENT DOCUMENTS 0035583  3/1980  Japan .................. 307/549

OTHER PUBLICATIONS

Journal of Speech and Hearing Research vol. 25, 15-25, Mar. 1982 Evaluation of High-Fidelity Hearing Aids. M. C. Killion and T. W. Tillman.
Hearing Instruments, vol. 39, No. 10 1988 "An accoustically visible hearing aid" by Mead C. Killion.
Handbook of Hearing Aid Amplificaiton, vol. I; Theoretical and Technical Considerations Ch 3, pp. 45-79 College-Hill Press.

Primary Examiner—John Zazworsky
Attorney, Agent, or Firm—McAndrews, Held & Malloy, Ltd.

[57] ABSTRACT

A current controlled variable attenuator circuit using a current controlled resistor is disclosed. In paticular, the current controlled resistor and attenuator are particularly suited for use in hearing aids due to the resistor's and attenuator's easy implementation in bipolar integrated circuits. The current controlled resistor and attenuator also has wide application to other circuitry requiring controlled variable resistance elements having a broader linear response than previously available. The current controlled resistor consists of transistors having inherent non-linear characteristics which can be linearized by adding appropriate compensation circuitry.

8 Claims, 4 Drawing Sheets

1

VARIABLE ATTENUATOR CIRCUIT

BACKGROUND OF THE INVENTION

1. Field of the Invention

This invention relates to a current controlled variable attenuator circuit using a current controlled resistor and more particularly to a current controlled resistor means for use in a high-fidelity hearing aid. The current controlled variable attenuator circuit limits input signal levels received from a hearing aid microphone to prevent overload of the hearing aid output amplifier or to prevent discomfort to the hearing aid user. The current controlled resistor means also provides a current controlled variable resistor useful in other applications requiring a broader linear response than presently available from saturated bipolar transistors used as current- or voltage-controlled resistors.

2. Background of the Prior Art

One prior art approach can be seen in Killion, U.S. Pat. No. 4,170,720. That particular hearing aid used a field effect transistor (FET) in shunt with the microphone output terminal of a hearing aid. The FET was used to limit the sound level input to prevent the linear output capabilities of the hearing aid amplifier from being exceeded, or to prevent the sound level pressure delivered to the user's ear from being uncomfortable. While the FET could handle input signal levels of from 50 to 100 millivolts with adequate linearity, suitable FET devices are not readily available in conventional bipolar circuits such as are typically used in hearing aids. A saturated bipolar transistor can be used as a variable attenuator, but above a 3 millivolt input signal level the output of a bipolar transistor attenuator become non-linear as described in detail in the aforementioned patent.

SUMMARY OF THE INVENTION

This invention was evolved with the general object of providing a current controlled variable attenuator circuit suitable for inclusion in a bipolar integrated circuit but having a wider range of linearity than previously available. The resulting current-controlled resistive means has wide application, particularly in the processing of audio signals where prior bipolar transistor current controlled resistive networks became non-linear at high signal input levels. In particular, their non-linearities produce distortions which are unacceptable when attenuating signals requiring accurate reproduction.

It is an object of the invention to provide a current-controlled resistor means which can handle substantially greater input voltage levels without objectionable distortion than could be accommodated by previously available bipolar current- or voltage-controlled resistor means.

It is also an object of the invention to provide for a current controlled resistor which uses bipolar transistors so that such a circuit can be easily fabricated using bipolar integrated circuit technology.

It is still another object of the invention to provide a current controlled voltage divider to be used for attenuating hearing aid microphone input signals without distortion thereby making possible a high fidelity hearing aid.

Another object of the invention is to provide a multiple-transistor current controlled resistor means which uses scaled transistor areas of an integrated circuit to form a successive approximation to a linear resistance.

In accordance with the invention, the multiple transistor current-controlled resistor means provides a variable-level low-distortion output signal derived from an input signal. When such a current controlled resistor is used in a voltage divider network, an appropriate output response to a given input signal can be fashioned. Since this circuit generates a low distortion output signal, its application is particularly useful in hearing aid devices. A simpler version which requires fewer components and yet may provide adequate performance in many instances can also be constructed in accordance with this invention.

The present current controlled resistor means, when used in a voltage divider circuit, can accurately reproduce input signals and attenuate excessively high level input signals. The voltage divider network is constructed such that attenuation of at least 20 dB can be obtained with a control current of approximately 100 microamperes.

These and other objects, features and advantages will become more fully apparent from the following detailed description taken in conjunction with the accompanying drawings.

DESCRIPTION OF PREFERRED EMBODIMENTS

Figure 1:
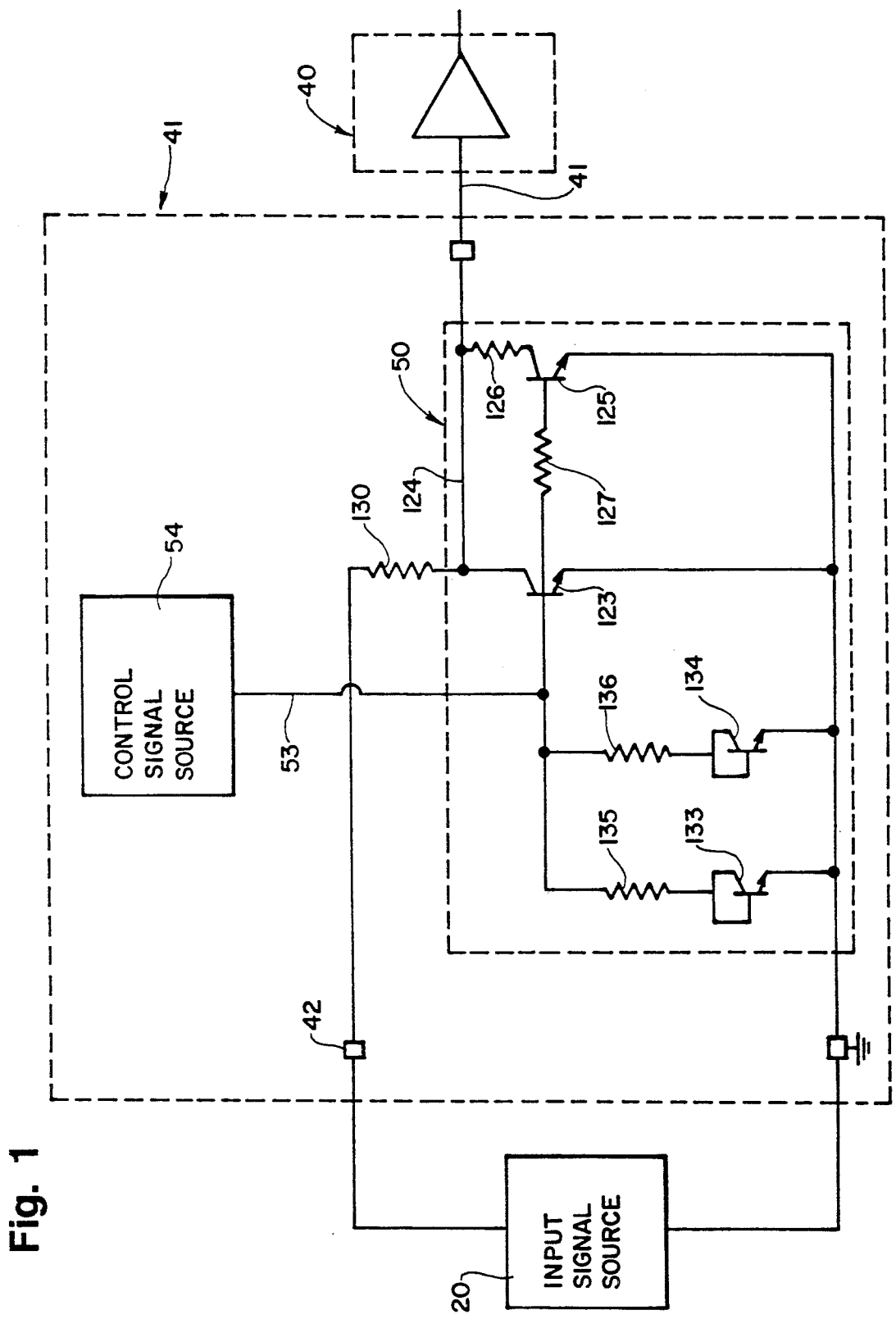
FIG. 1 is a schematic diagram of a multiple-transistor current controlled resistor used in a voltage divider circuit constructed in accordance with the invention.

Referring now to FIG. 1, an input signal source 20 provides an input signal to variable attenuator circuit 41, which includes a multiple-transistor current- or voltage-controlled resistor means 50 in which the current or voltage control acts to vary the resistance. The controlled resistor means 50 uses a two-transistor approximation to a linear resistance in a voltage divider network. The two transistors are driven at their bases by a drive signal which controls the amount of resistance provided by each transistor in a voltage divider network. The level of the input signal is controlled at the output of the variable attenuator circuit by a control signal which can either be independent of an input voltage signal or can be a feedback signal derived from the level of an input voltage signal.

It should be understood that input signal source 20 may include the microphone and/or telecoil of a hearing aid, along with a suitable DC decoupling capacitor.

In a preferred embodiment, the current controlled resistor means 50 includes a transistor 123 having a grounded emitter and having a collector which is connected to a line 124 which forms an output line connected to the input 41 of an amplifier circuit 40. The base of transistor 123 is connected to the output line 53 of the control signal source 54, which in the preferred embodiment includes a high output-impedance source of control current, conduction of the transistor 123 being thereby controlled by the control current from the circuit 54.

A second transistor 125 has a grounded emitter and has a collector connected through a resistor 126 to the line 124, the base of transistor 125 being connected through a resistor 127 to the line 53. The conduction of the transistor 125 is thereby also controlled from the output of the control current source 54 but with a different response characteristic. Also, the transistor 125 has characteristics different from those of the characteristics of transistor 123.

In a preferred embodiment, the effective area of the transistor 125 is ten times that of the transistor 123. Line 124 is connected through a resistor 130 to the terminal 42 which is connected to an input signal source 20.

In the operation of the circuit as thus far described, a voltage-divider action is obtained, the output signal at line 124 being a certain fraction of the input signal voltage, depending upon the ratio of the impedance provided by the transistors 123 and 125 and resistor 126 to the total impedance, including the impedance provided by a resistor 130 and the effective internal impedance of the signal source 20.

As the control current applied through line 53 from the control signal source increases, the effective impedance between line 124 and ground drops thereby increasing the attenuation of the input signal. With the two transistors 123 and 125 and resistors 126 and 127 as shown, and with the proper characteristics of the transistors 123 and 125, a scaling action is obtained such as to improve the linearity of response over a wide dynamic range.

It is found, however, that the response is not completely linear with only the transistors 123 and 125 and associated resistors 126 and 127 and that substantially improved results are obtained through the addition of at least one and preferably two transistors 133 and 134 as shown to compensate for inherent non-linear characteristics of transistors 123 and 125, transistors 133 and 134 having bases and collectors connected together to operate as diodes and being connected through resistors 135 and 136 to the control current line 53. Transistor 134 can advantageously have a larger area than transistor 133, by a factor of 3× in the preferred embodiment. Other semi-conductor elements such as diodes can also be used in place of transistors 133 and 134 if the circuit is made of discrete components.

The operation of current controlled resistor means 50 can be described in more detail by showing the progression of circuit design from a single transistor circuit to the present current-controlled resistor means 50. Output voltage versus input voltage graphs for each circuit indicate the increasingly linear response of each circuit.

Figure 2:
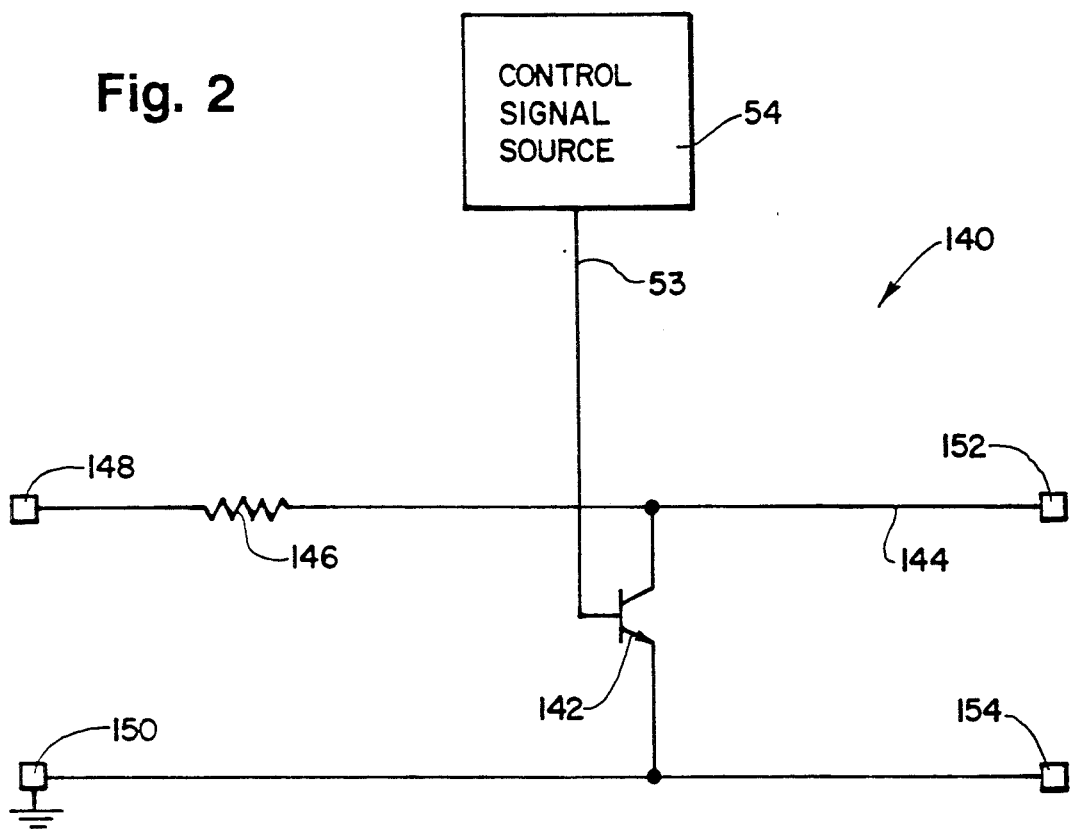
FIG. 2 is a schematic diagram of a single transistor current controlled variable attenuator circuit.

Referring now to FIG. 2, a single transistor current controlled variable attenuator circuit 140 is shown. Attenuator circuit 140 includes a transistor 142 having a grounded emitter and having a collector connected to a line 144 forming an output line. The base of transistor 142 is connected to the output line 53 of control signal source 54, conduction of the transistor 142 being controlled by the control signal. The collector of transistor 142 is connected through an impedance in the form of a resistor 146 to a terminal 148 so that a voltage divider is formed between resistor 146 and the collector-to-emitter resistance of transistor 142. The circuit has output terminal 152 connected to line 144 and an output terminal 154 which is grounded.

Figure 3:
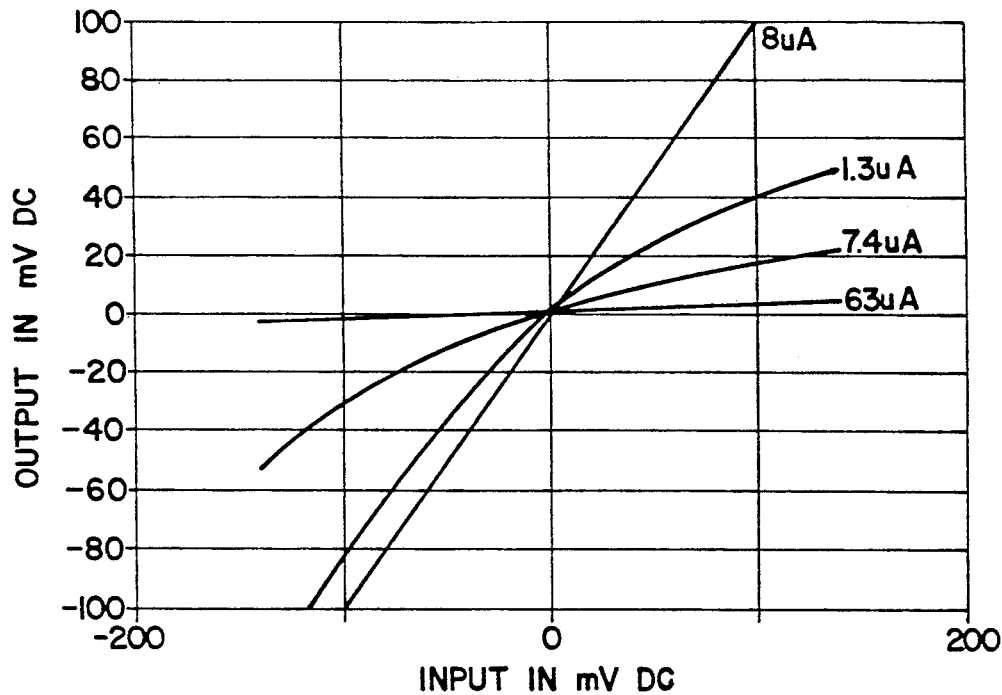
FIG. 3 is an illustration of the output versus input voltage characteristics of a single transistor current controlled variable attenuator circuit shown in FIG. 2.

FIG. 3 illustrates the output versus input voltage characteristics of single-transistor current controlled attenuator circuit 140 for a variety of control currents delivered by control signal source 54, with resistor 146 having a value of 10 kOhms and transistor 143 obtained from Gennum Corporation's LA202-001A integrated-circuit transistor array with the substrate pin of the array connected to ground. As can be seen from the graph of FIG. 3, the output voltage versus input voltage response curves for various base currents is non-linear except for small input voltage excursions. For all base currents other than zero microamps, the input-output plots are not straight, but curved, illustrating the nonlinearity which creates the unacceptable distortion for input signal voltages above approximately 3 mV rms AC that was previously shown in the dashed curve of FIG. 6 of the aforementioned U.S. Pat. No. 4,170,720.

In accordance with the invention, compensation means are provided which operate over a range of control currents and a range of input voltages to reduce non-linearities of the output voltage versus input voltage response curves of a transistor as illustrated in FIG. 3.

Figure 4:
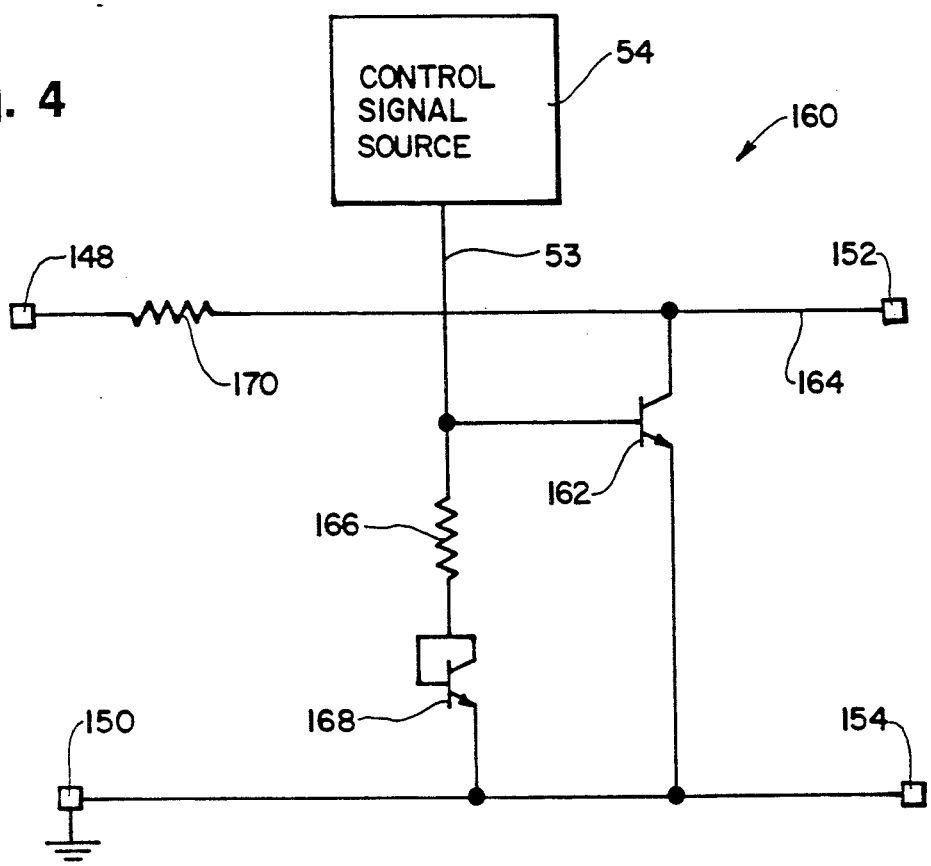
FIG. 4 is a schematic diagram of a diode-transistor variable attenuator circuit.

FIG. 4 illustrates a diode-transistor variable attenuator 160. Attenuator 160 includes a transistor 162 having a grounded emitter and having a collector connected to a line 164 forming an output line. The base of transistor 162 is connected to the output line 53 of control signal source 54, conduction of the transistor 162 being controlled by the current from source 54.

In the course of experiments, we discovered that greater linearity in the input-output characteristic could be obtained if the base of transistor 162 is also coupled to ground through a compensation means comprised of a series combination of a resistor 166 and a transistor 168 which is wired to act as a diode, with the base and collector of transistor 168 shorted together and connected to one end of resistor 166. The emitter of transistor 168 is connected to ground.

The collector of transistor 162 is connected through a resistor 170 to an input terminal 148. The circuit has output terminal 152 connected to line 164 and an output terminal 154 which is grounded.

Figure 5:
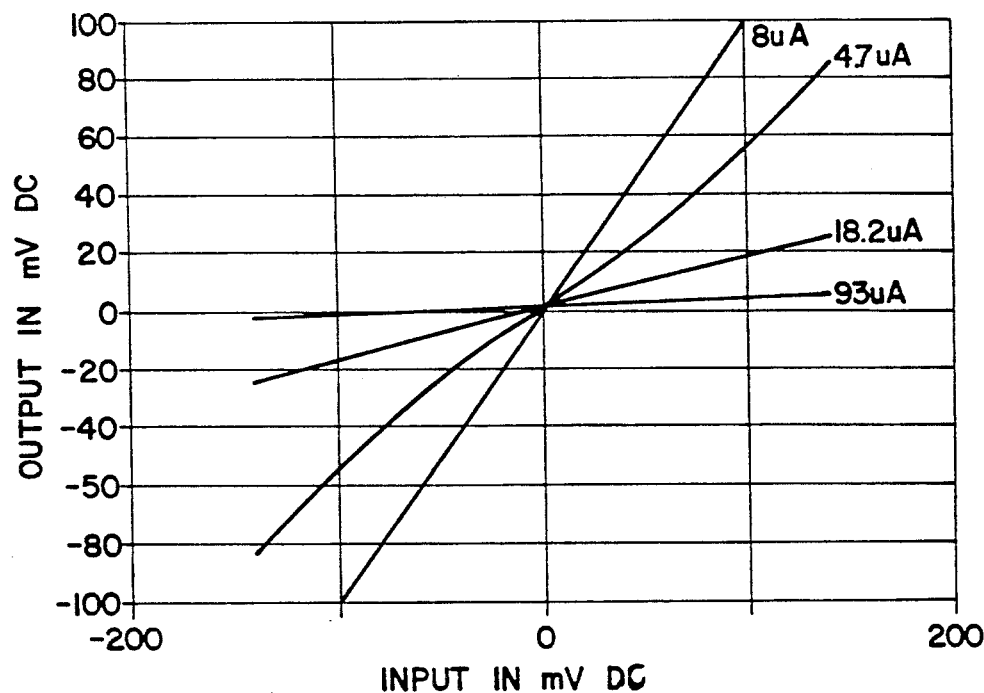
FIG. 5 is an illustration of the output versus input voltage characteristics of the diode-transistor variable attenuator circuit shown in FIG. 4.

FIG. 5 illustrates the output versus input voltage characteristics of diode-transistor variable attenuator 160, with resistor 170 having a value of 10 kOhms, transistors 162 and 168 obtained from the aforementioned LA202-001A transistor array, and resistor 166 having a value of 1.2 Kohms. As can be seen from FIG. 5 in comparison with FIG. 3, the addition of resistor 166 and transistor 168 configured as a diode has greatly improved the linearity of the input-output curves for a variety of control currents. The addition of the compensation means formed by transistor 168 and an impedance represented by resistor 166 has smoothed out the non-linearities of single-transistor current controlled attenuator circuit 140. Indeed, this improvement may be adequate for many applications, although appreciable non-linearity can still be seen when higher-level voltages are applied at the input.

Figure 6:
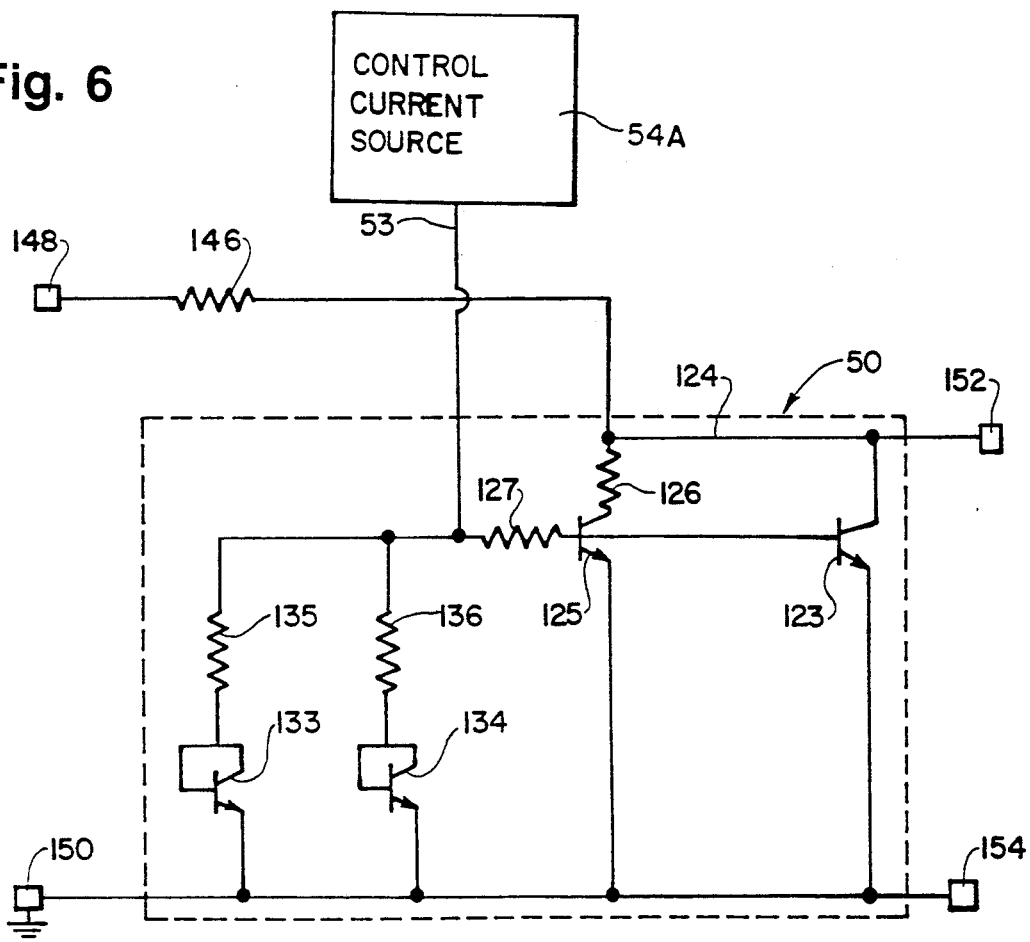
FIG. 6 is a schematic diagram of a four-transistor current-controlled variable attenuator circuit.

Based on an analysis of the characteristics of the single-transistor current-controlled attenuator circuit 140 and the diode-transistor current-controlled attenuator 160, the four-transistor approximation to a linear resistor in a voltage divider network was developed. The resulting circuit is shown in FIG. 6, where control signal source 54 has been arranged to provide a high-impedance source of control current shown as means 54A in FIG. 6. In this embodiment, compensation means are provided which include the transistors 133 and 134 which are connected to operate as diodes and which are connected in series with the resistors 135 and 136 between the base and emitter electrodes of transistor 123, and such compensation means also includes the transistor 125 having collector and base electrodes connected through resistors 126 and 127 to the collector and base electrodes of transistor 123 and having an emitter electrode connected directly to the emitter electrode of transistor 123. Current controlled resistor means 50 has line 124 connected through a resistor 146 to a terminal 148. Line 124 is also connected to output terminal 152. The emitter terminals of transistors 123, 125, 133 and 134 are all grounded to ground terminal 150 and output terminal 154.

To illustrate the increasingly linear response characteristics of current controlled resistor means 50, a voltage output versus voltage input graph was generated by implementing current controlled resistor means 50 as was done for the circuits shown in FIGS. 2 and 4, with resistor 146 having a value of 10 kOhms. A further increase in input-output linearity is obtained from appropriately scaling the effective areas of transistors 123, 125, 133 and 135, and choosing the values of resistors 126, 127, 135 and 136. For the graph of FIG. 7, the effective area of transistor 125 is ten times the area of transistor 123 and the effective area of transistor 133 is 3 times that of transistor 123, which effective areas are obtained by appropriate paralleling of individual devices in the aforementioned transistor array LA202-001A. Resistor 126 is 47 Kohm; resistor 127 is 33 Kohm; resistor 135 is 3.9 Kohm; and resistor 136 is 4.7 Kohm. Similar linearity has been experimentally verified when the circuit of FIG. 6 was implemented in a bipolar integrated circuit having emitter areas of transistors 125 and 133 scaled appropriately in mask layout and resistors obtained from thin film resistors deposited on the integrated circuit itself.

Figure 7:
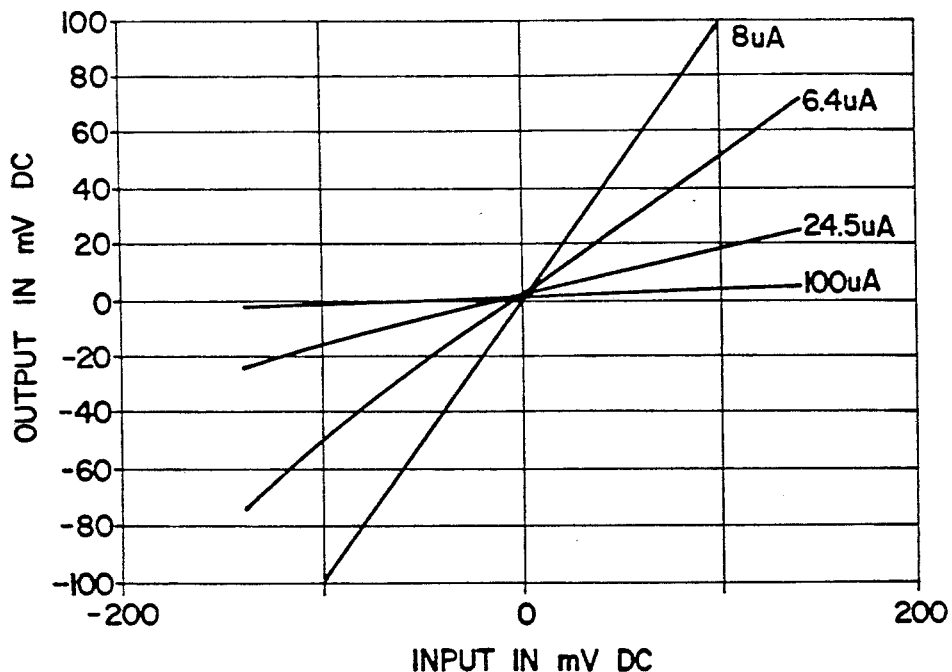
FIG. 7 is an illustration of the output versus input voltage characteristics of the four-transistor current-controlled variable attenuator circuit shown in FIG. 6.

As seen in FIG. 7, the output voltage versus input voltage curves becomes linear over a broad range of input voltages and control currents. Indeed, we have found that with the more extensive compensation means of the circuit of FIG. 6, AC input signals of 100 mV rms or greater may be attenuated in a controlled manner over a range of 20 to 30 dB or more, while maintaining a total harmonic distortion of less than 4%. That level of distortion is generally inaudible for high-level speech and music input signals which correspond to reproduced levels of 100 to 120 dB SPL, as illustrated in FIG. 3-7 of the chapter "Principles of high fidelity hearing aid amplification," by Mead C. Killion (in *Handbook of Hearing Aid Amplification, Volume* 1: *THEORETICAL AND TECHNICAL CONSIDERATIONS*, edited by R. E. Sandlin; College Hill Press, Little, Brown and Company, Boston, 1988). The described current-controlled variable attenuator is thus suitable for use in even the highest-fidelity hearing aids, where its large-signal handling capability make it possible to handle microphone signals equivalent to 110 to 120 dB SPL without noticeable distortion. Previous hearing aid designs typically overload and distort badly for inputs exceeding 90 to 100 dB SPL.

It will be understood from the foregoing that compensation means are provided which operate over a range of control currents and a range of input voltages to reduce non-linearities of the output voltage versus input voltage response curves of a transistor as illustrated in the graph of FIG. 3. In the embodiment of FIG. 4, such compensation means includes the resistor 166 and the transistor 168 connected between the base and emitter electrodes of transistor 162 and operative to substantially reduce non-linearities of the output voltage versus input voltage response curves, as is illustrated in the graph of FIG. 5. In the embodiment shown in FIG. 1 and also shown in FIG. 6, such compensation means includes the transistors 133 and 134 which are connected to operate as diodes and which are connected in series with the resistors 135 and 136 between the base and emitter electrodes of transistor 123, and such compensation means also includes the transistor 125 having collector and base electrodes connected through resistors 126 and 127 to the collector and base electrodes of transistor 123 and having an emitter electrode connected directly to the emitter electrode of transistor 123. The result is to greatly reduce non-linearities in the output voltage versus input voltage response curves, as is shown in the graph of FIG. 7. Each of the transistors 133 and 134 in the embodiment of FIG. 1 and the transistor 168 in the embodiment of FIG. 4 provide in each case a semi-conductor means which has non-linear characteristics operating in opposing compensating relation to non-linear characteristics of the transistor to which it is connected. In the embodiment of FIG. 1, the semi-conductor means formed by transistors 133 and 134 are connected in parallel relation. Each of the transistors of the illustrated circuits is an NPN transistor.

The foregoing description of the invention has been presented for purposes of illustration and description. It is not intended to limit the invention to the precise forms disclosed, and obviously many modifications and variations are possible in light of the above teachings.

What is claimed is:

1. A current-controlled variable resistance circuit arranged for presenting broad linear response characteristics with respect to applied AC signals, comprising: transistor means having first and second output terminals and a third control terminal for receiving a control signal to control current flow between said first and second output terminals, said transistor means having inherent non-linear characteristics such that with said output terminals connected through a series resistance to an input voltage source and such that over a certain extended range of control currents applied to said control terminal and within a certain extended range of input voltages applied from the input voltage source there are substantial non-linearities in output voltage versus input voltage response curves obtainable by measuring output voltages developed between said first and second output terminals of said transistor means while adjusting control currents applied to said third control terminal through a number of values and at each control current value varying and measuring an input voltage applied from an input voltage source and through said series resistance to said first and second output terminals, and compensation means connected to and arranged to conduct current between two of said first, second and third terminals of said transistor means and having a voltage-current relationship such as to operate over said certain extended range of control currents and said certain extended range of input voltages to substantially reduce non-linearities of said output voltage versus input voltage response curves and at least partially compensate for said inherent non-linear characteristics of said transistor means to thereby present broad linear response characteristics with respect to AC signals applied to said first and second terminals of said transistor means.

2. A variable resistance circuit as defined in claim 1, wherein said compensation means includes a semi-conductor junction.

3. A variable resistance circuit as defined in claim 1, wherein said compensation means is coupled to said third control terminal and one of said first and second output terminals.

4. A variable resistance circuit as defined in claim 3, wherein said transistor means includes a transistor having emitter and collector electrodes coupled to said first and second output terminals and a base electrode coupled to said third control terminal, and wherein said compensation means includes semi-conductor means coupled between said base electrode and one of said emitter and collector electrodes.

5. A variable resistance circuit as defined in claim 4, wherein said semi-conductor means includes a plurality of semi-conductor elements, and coupling means coupling said semi-conductor elements in parallel relation.

6. A variable resistance circuit as defined in claim 5, wherein said semi-conductor elements have substantially different effective areas.

7. A variable resistance circuit as defined in claim 6 wherein said coupling means includes resistance means in series with said semi-conductor elements.

8. A variable resistance circuit as defined in claim 1, wherein said transistor means includes at least one transistor having output electrodes coupled to said first and second output terminals and a control electrode coupled to said third control terminal, and wherein said compensation means includes at least one transistor coupled between said output terminals and having output electrodes coupled to said first and second output terminals and a control electrode coupled to said third control terminal, thereby providing a plurality of transistors operative in generally parallel relation to one another, said plurality of transistors having different areas and having characteristics such that each provides improved linearity in an output voltage range in which another of said plurality of transistors acting alone would produce relatively highly non-linear characteristics.

* * * * *